United States Patent
Orton et al.

[19]

[11] Patent Number: 6,118,306
[45] Date of Patent: Sep. 12, 2000

[54] CHANGING CLOCK FREQUENCY

[75] Inventors: John T. Orton, Los Altos; Cau L. Nguyen, Fremont, both of Calif.; Gurbir Singh, Portland, Oreg.; Xia Dai, Fremont, Calif.; Raviprakash Nagaraj; Edwin J. Pole, II, both of Hillsboro, Oreg.

[73] Assignee: Intel Corporation, Santa Clara, Calif.

[21] Appl. No.: 09/302,931

[22] Filed: Apr. 30, 1999

Related U.S. Application Data

[63] Continuation of application No. 09/204,529, Dec. 3, 1998.

[51] Int. Cl.[7] .................................................. G01R 23/02
[52] U.S. Cl. .......................................... 327/44; 327/45
[58] Field of Search ................................. 327/44, 45, 99, 327/298; 395/556

[56] References Cited

U.S. PATENT DOCUMENTS

| | | | |
|---|---|---|---|
| 4,615,005 | 9/1986 | Maejima et al. | 364/200 |
| 5,222,239 | 6/1993 | Rosch | 395/750 |
| 5,319,772 | 6/1994 | Hwang | 395/550 |
| 5,381,116 | 1/1995 | Nuckolls et al. | 331/1 A |
| 5,475,324 | 12/1995 | Timiyori | 327/145 |
| 5,479,644 | 12/1995 | Hongo | 395/550 |

*Primary Examiner*—Toan Tran
*Assistant Examiner*—Linh Nguyen
*Attorney, Agent, or Firm*—Trop, Pruner & Hu, P.C.

[57] ABSTRACT

A system includes a component (e.g., a processor) that includes a clock generator that generates an internal clock running at a frequency. A controller generates a clock frequency change indication and places the component into a low activity state (e.g., deep sleep, stop grant, or other state). The clock generator is reset by the clock frequency change indication to change the clock's frequency while the component is in the low activity state. Storage elements containing different values are selectable to set the clock frequency. The storage elements include fuse banks and input pins.

35 Claims, 10 Drawing Sheets

CHANGING CLOCK FREQUENCY

CROSS-REFERENCE TO RELATED APPLICATION

This application is a continuation of copending U.S. Ser. No. 09/204,529, filed Dec. 3, 1998, entitled "CHANGING CLOCK FREQUENCY."

BACKGROUND

The invention relates to changing clock frequencies.

In a system, some components may run at core or internal clock frequencies that are higher than the frequency of an external clock (such as a bus clock) to the components. Components may include a microprocessor, a microcontroller, an application-specific integrated circuit (ASIC) a programmable gate array (PGA), or any other device which can run at core speeds many times greater than the bus clock speed. The component's core clock frequency may be at a lower level for power reduction, which may be advantageous in a portable system where battery life is limited. Another advantage may be that system design is simplified by maintaining external clock speeds at lower levels.

In some microprocessors, such as the Pentium® family of processors from Intel Corporation, the ratio of the core clock frequency to bus clock frequency may be specified at system reset. This ratio may be set using bus fraction data defined by one or more input/output (I/O) pins that are sampled during system reset, for example. The states of the one or more I/O pins may be latched internally on the deactivating edge of a processor reset signal.

Conventionally, the core clock frequency to external clock frequency ratio is set during reset in current processors. Once the clock ratio is set, it remains at that value until the next time the system resets. This may limit the performance level of the system. It is inconvenient to reset the system to change clock frequencies, as the reset process typically may take a relatively long period of time.

SUMMARY

In general, according to one embodiment, a component includes a clock having a frequency. A clock frequency change indication is generated, and the component is placed into a low activity state. An internal clock generator is reset to adjust an internal clock frequency while the component is in the low activity state in response to the clock frequency change indication.

Other features will become apparent from the following description and from the claims.

DETAILED DESCRIPTION

According to embodiments of the invention, the core operating frequency of a component may be changed at any time during system operation, not only during the system's reset period. Components may include a general-purpose or special-purpose processor such as a microprocessor or microcontroller, an application-specific integrated circuit (ASIC), a programmable gate array (PGA), or any other device which may have an internal clock that may be set to a different frequency than an external clock.

The ability to vary a component's core clock frequency allows flexibility in controlling power consumption by the component. Further, this may be advantageous in a portable system (such as a portable or notebook computer, a hand-held electronic device, and the like) that can alternately operate off a battery power source or an external power source (such as an alternating current or AC outlet) although the invention is not limited in scope in this respect. When the battery is used to power the portable system, reducing power consumption is desirable due to limited battery life. One way to reduce power consumption is by placing a component, such as a processor, into a lower power state, e.g., by reducing the core operating frequency of the processor by changing the setting of an internal clock generator. To further reduce power consumption, the processor's core voltage level may also be reduced since power consumption is generally proportional to the square of the supply voltage level.

However, when the portable computer is coupled to an external power source, such as through an AC adapter or a docking base unit, it may be desirable to increase the performance level of the system by transitioning the processor to a higher performance state by increasing its core clock frequency and supply voltage level.

According to embodiments of the invention, component core clock speeds may be varied by resetting an internal clock generator without requiring that the component be reset, which may cause it to lose internal register settings and increase system overhead. In the description that follows, the component in which core clock speeds are varied is the processor. A similar technique may be applied to other components, such as bridge chips or other types of devices in further embodiments of the invention.

The processor's core clock frequency may be changed by transitioning the processor to a low activity state, e.g., stop grant state or deep sleep state or the C2 and C3 states defined by the Advanced Configuration and Power Interface (ACPI) Specification, Rev. 1.0, published on Dec. 22, 1996, although the invention is not restricted in scope to these examples. Other low activity states may also be used in which the processor's internal clock is stopped but which allows the processor to maintain certain settings (e.g., registers, internal cache, and so forth). While the processor is in a low activity state, the clock frequency may be changed. In a deep sleep state, such as the C3 state defined by the ACPI specification, for example, an external clock to the processor is stopped. In the stop grant state or the C2 state of the ACPI specification, an internal clock of the processor is stopped although the external clock may continue to run.

The core operating clock frequency of the processor may be adjusted up or down transparently to a user. This provides greater flexibility in the system's power management. In addition, the ability to transition to a higher processor clock speed may improve system performance.

Figure 1:
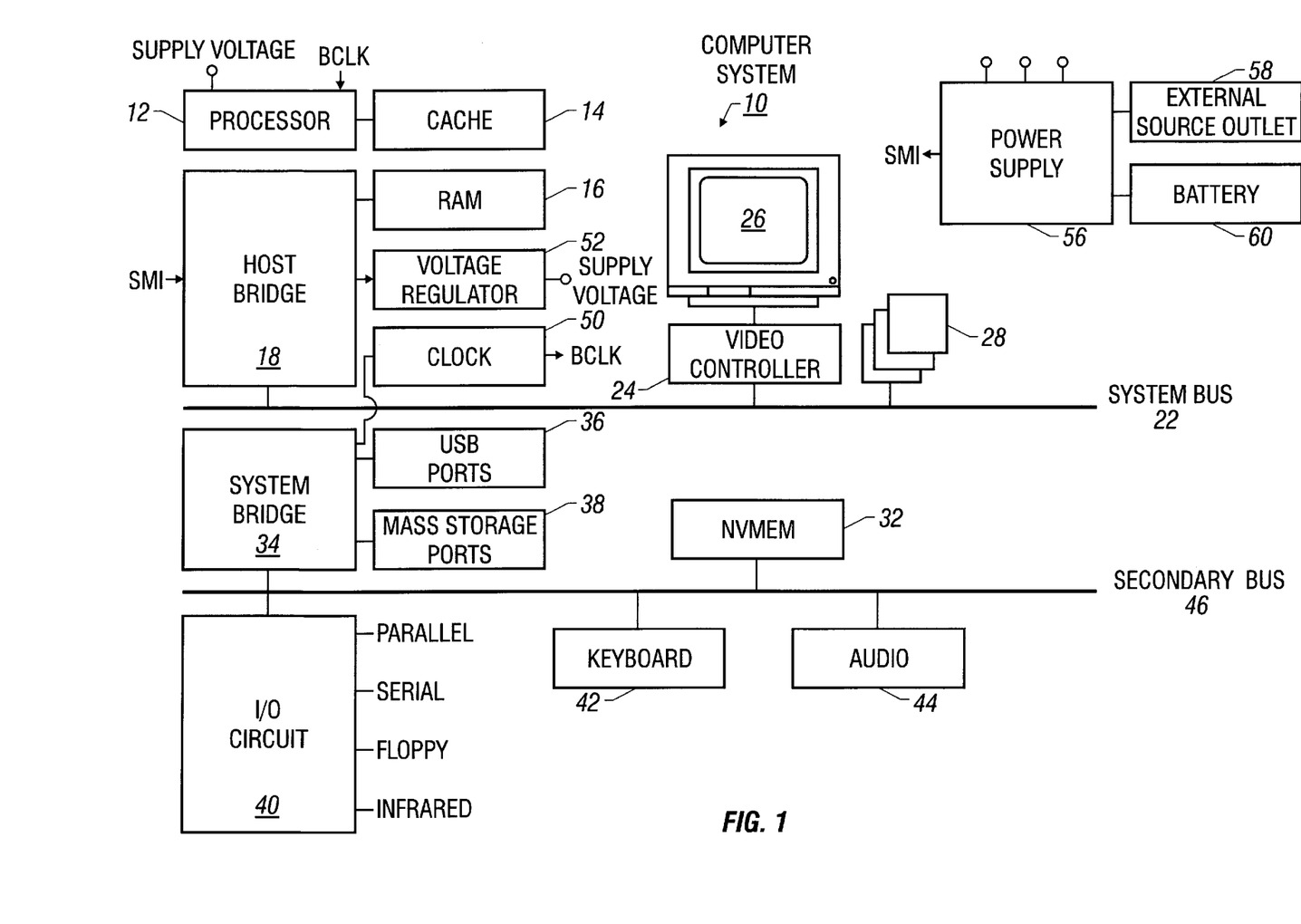
FIG. 1 is a block diagram of a system according to an embodiment of the invention.

Referring to FIG. 1, an example system 10 that incorporates an embodiment of the invention includes a processor 12 (e.g., an 80×86 or Pentium® family processor from Intel Corporation) that receives an external clock BCLK 102 (from a clock generator 50) and a supply voltage (from a voltage regulator 52). The system 10 may include a general-purpose or special-purpose computer, a microprocessor- or microcontroller-based system, a hand-held computing device, a set-top box, an appliance, a game system, or any controller-based system in which the controller may be a programmable device such as an ASIC or PGA.

The voltage regulator 52 and the clock generator 50 are both controllable to adjust the core voltage levels as well as the core clock frequencies in the processor 12, as further described below. Before transitioning the power states of the processor 12 (to change its core clock frequency as well as its core supply voltage level), the processor 12 is placed into a low activity state, either by stopping the external clock BCLK to the processor 12 or by placing the processor 12 into a low or reduced activity state such as the stop grant or C2 state.

The main power supply voltages in the system 10 are provided by a power supply circuit 56 that is coupled to a battery 60 and an external power source port 50. When the external power source (not shown) is plugged in or removed, an interrupt (e.g., a system management interrupt or SMI) may be generated to notify system software of the external power source insertion or removal. In addition, docking the system 10 to a docking base unit may also indicate a power source transition. In one embodiment, a device driver may receive indications of power source transitions and docking events by registering with the operating system for power and plug-and-play notifications, for example. Additionally, the system 10 may provide a graphical user interface through which a user may specify the desired performance state of the system.

The processor 12 may be coupled to a cache memory 14 as well as to a host bridge 18 that includes a memory controller for controlling system memory 16. The host bridge 18 is further coupled to a system bus 22, which may in one embodiment include a Peripheral Component Interconnect (PCI) bus, as defined in the PCI Local Bus Specification, Production Version, Rev. 2.1, published on Jun. 1, 1995. The system bus 22 may be coupled to other components, including a video controller 24 coupled to a display 26 and peripheral slots 28. A secondary or expansion bus is coupled by a system bridge 34 to the system bus 22. The system bridge includes interface circuits to different ports, including a universal serial bus (USB) port 36 (described in the Universal Serial Bus Specification, Revision 1.0, published in January 1996) and mass storage ports connectable to mass storage devices such as a hard disk drive, a compact disc (CD) or digital video disc (DVD) drives, and the like.

Other components coupled to the secondary bus 46 includes an input/output (I/O) circuit 40 that may be coupled to a parallel port, serial port, floppy drive, and infrared port. A non-volatile memory 32 for storing basic input/output system (BIOS) routines may be located on the bus 46, as may a keyboard device 42 and an audio control device 44, as examples.

It is to be understood, that the described components in the system 10 are for illustrative purposes and the invention is not limited in scope to the illustrated system.

Various software or firmware layers (formed of modules or routines, for example), including applications, operating system modules, device drivers, BIOS modules, and interrupt handlers, may be stored in one or more storage media in the system. The storage media includes the hard disk drive, CD or DVD drive, floppy drive, non-volatile memory, and system memory. The modules, routines, or other layers stored in the storage media contain instructions that when executed causes the system 10 to perform programmed acts.

The software or firmware layers can be loaded into the system 10 in one of many different ways. For example, code segments stored on floppy disks, CD or DVD media, the hard disk, or transported through a network interface card, modem, or other interface mechanism may be loaded into the system 10 and executed as corresponding software or firmware layers. In the loading or transport process, data signals that are embodied as carrier waves (transmitted over telephone lines, network lines, wireless links, cables, and the like) may communicate the code segments to the system 10.

Figure 2:
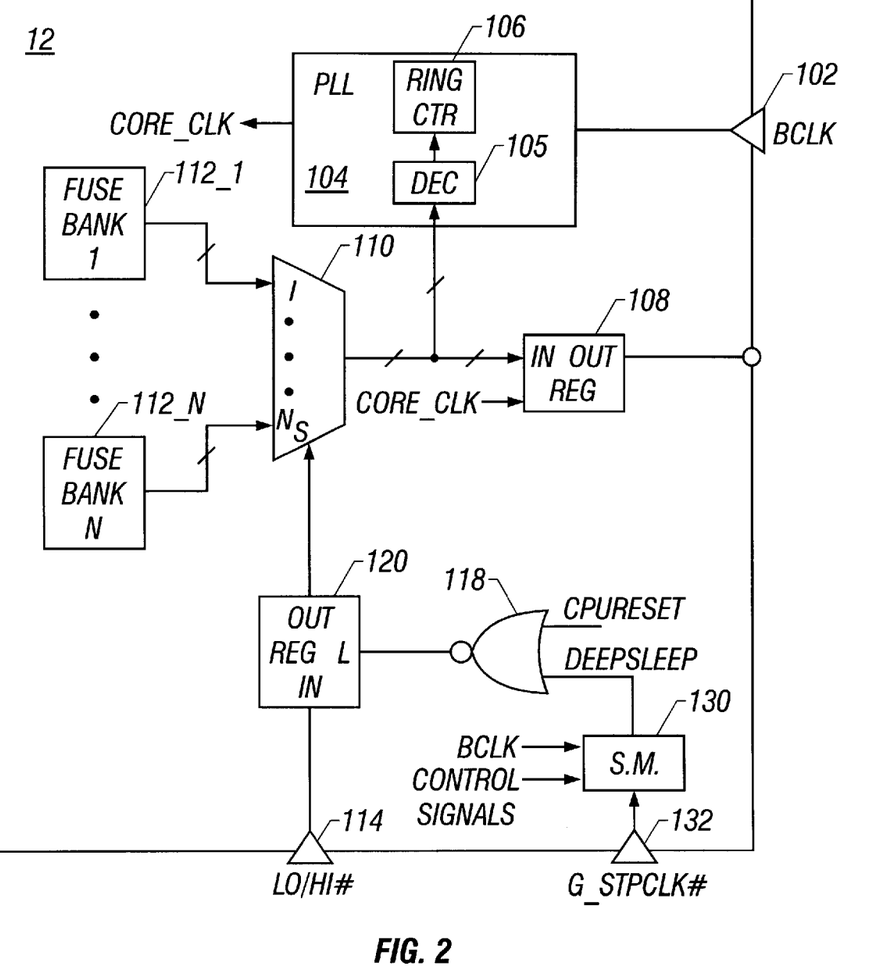
FIGS. 2–4 are block diagrams of circuits that have one capability to adjust a component's core clock frequency according to different embodiments of the invention.

Referring to FIG. 2, the circuitry used in the processor 12 (or other component) of an embodiment of the invention to control core clock frequency is illustrated. According to the embodiment of FIG. 2, the processor 12 includes multiple fuse banks 112_1 to 112_N (N being an integer greater or equal to two) that are connected to inputs of a steering multiplexer 110 (or other selection circuit) controllable by one or more select inputs to route a fuse bank output value to an input of a phase locked loop (PLL) circuit 104 and a register 108. The fuse banks 112_1 to 112_N provide bus fraction data or some other predefined data value or indication that is used to control the processor's clock frequency. The register 108, which may be a model-specific register (MSR) or a CPU ID register, for example, is accessible by software to determine the processor's core clock frequency.

Although reference is made to specific signals and circuitry, it is to be understood that the invention is not limited in scope to the illustrated embodiments.

In the illustrated embodiment, one input pin 114 may be used to receive a signal LO/HI# that indicates whether a core clock CORE_CLK of the processor 12 is to be set at the setting of the low performance state or the high performance state. Additional input pins 114 may be used to select greater than two frequency settings. The signal LO/HI# is latched by a register 120 controlled by the output of NOR gate 118 When the NOR gate output terminal is low, the state of the signal LO/HI# is allowed to flow through the register 120, but when the NOR gate output terminal is high, the state of LO/HI# is latched by the register 120. The input pins of the NOR gate 118 receive a signal CPURESET (that when active indicates processor reset) and a signal DEEPSLEEP (that when active indicates the processor is in a low activity state, such as the deep sleep, stop grant, C2, or C3 state). The NOR gate 118 asserts its output terminal low when the processor 12 is either in reset or a low activity state.

The signal DEEPSLEEP may be provided by a state machine 130 in the processor 12 that controls transition of the processor 12 into the low activity state. In one example, the state machine 130 may receive a signal G_STPCLK# from an input pin 132, which when activated indicates a request to place the processor 12 into the stop grant state. The state machine 130 may also receive other control signals, as well as the external clock BCLK. If the low activity state is defined as the deep sleep state, then the state machine 130 detects for deactivation of the external clock BCLK (BCLK is stopped). Once the state machine 130 detects that the processor is in the predefined low activity state (e.g., stop grant, deep sleep, C2, or C3 state), it asserts the signal DEEPSLEEP to indicate that the processor is in the low activity state.

Alternatively, the low activity indication may be received from control logic implemented in another chip in the system. In that case, the signal DEEPSLEEP may come in through an input pin of the processor 12, such as a SLEEP# input.

Thus, during processor reset (CPURESET is high, for example) or when the processor is in the low activity state (the signal DEEPSLEEP is high, for example), the state of LO/HI# is allowed to flow through to the select input of the multiplexer 110. However, once the processor 12 exits from processor reset or from the low activity state, the register 120 latches the state of LO/HI# and prevents core clock frequency changes while the processor 12 is active. Depending on the state of the signal LO/HI#, one of the fuse bank output values is selected by the multiplexer 110 and outputted as a bus fraction value. If the multiplexer 110 has more than two inputs, additional select signals may be employed. The selected bus fraction value is used by the PLL circuit 104 to generate a core clock CORE_CLK having a frequency that is some multiple of the frequency of the external clock BCLK. In the PLL circuit 104, the bus fraction value from the multiplexer 110 may be decoded by a decoder 105 and provided to a Johnson ring counter 106, for example, to perform the multiplication function.

Using the circuitry described according to an embodiment of the invention, core clock frequency adjustments can be made while the system (including the operating system and application layers as well as other hardware components) remains operational. While the core clock frequency change is taking place, the processor 12 is placed into a low activity state during which interrupts may not be serviced. Thus, the transition is completed within a predetermined time period (e.g., less than 200 μsec) to prevent operating system failure. However, during the low or reduced activity state, stored contents and internal register settings may be maintained. In contrast, when the processor is reset, the stored contents and internal register settings are lost. When a reset occurs, system software or firmware layers may need to restore internal settings of the processor.

Figure 3A:
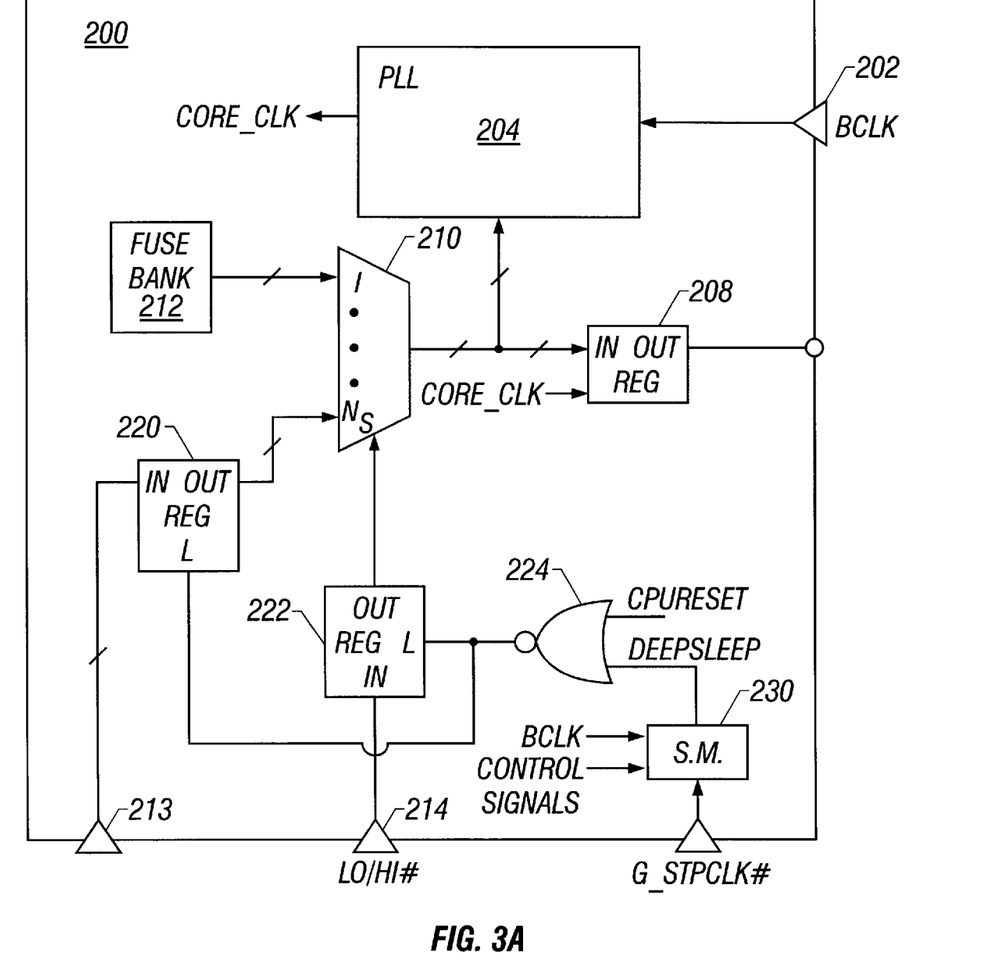

Referring to FIG. 3A, according to another embodiment of the invention, the bus fraction data in a processor 200 may be set by selecting values provided by one or more fuse banks 212 or a set of I/O pins 213. The signals from the fuse banks 212 are provided to one or more corresponding inputs of a steering multiplexer 210 while the signals from the set of I/O pins 213 are provided to another input of the multiplexer 210. The states of one or more performance state selection signals (e.g., the LO/HI# signal) on I/O pins 214 latched by a register 222 determine which value is selected for output by the multiplexer 210. The states of I/O pins 213 are latched by a register 220. If a Pentium® family processor is used, for example, then the I/O pins 213 may receive one or more of the following signals: LINT[1], LINT[1], A20M#, and IGNNE#. These four signals are not used during processor reset or in the processor's low activity state, and thus can specify the ratio of the core clock frequency to external clock frequency. Other suitable I/O pins of the processor may also be used.

Both registers 220 and 222 are controlled by the output terminal of a NOR gate 224, which receives signals CPURESET and DEEPSLEEP similar to the NOR gate 118 of FIG. 2. The signal DEEPSLEEP is provided by a state machine 230, or alternatively, by an input pin. The bus fraction data at the output terminal of the multiplexer 210 is provided to a register 208 as well as to a PLL circuit 204. Depending on the bus fraction value selected by the multiplexer 210, the PLL circuit 204 multiplies the frequency of the external clock BCLK received on pin 202 by the selected amount to produce the frequency of the core clock CORE_CLK. The output of the register 208 stores the selected bus fraction data and is accessible by software. The register 208 may be a model-specific register (MSR) or the CPU ID register, both accessible by software.

A value presented at I/O pins 213 is sampled by the register 220 (or other receiving circuitry) while the output of the NOR gate 224 is low (either CPURESET or DEEPSLEEP is high). When the processor exits from reset or from a sleep state (e.g., stop grant or deep sleep), the output of the NOR gate is driven high to latch the state of the pins 213 in the register 220.

Figure 3B:
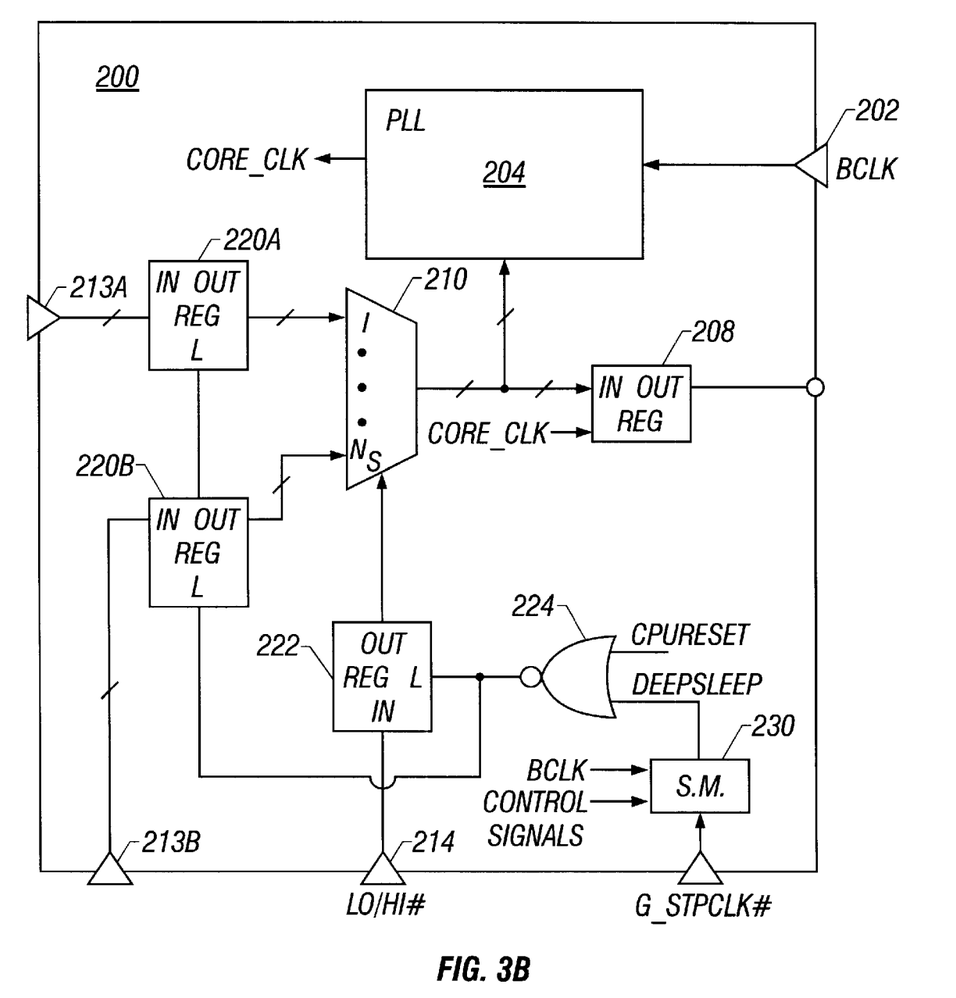

Referring to FIG. 3B, in a variation of the embodiment of FIG. 3A, the bus fraction data in the processor 200 may be set by selecting values provided by two or more sets of I/O pins 213A, 213B. Similar components as those in the FIG. 3A embodiment are designated with the same reference numerals. The signals from the sets of I/O pins 213A, 213B are coupled to corresponding inputs of the multiplexer 210 through respective registers 220A, 220B. The registers 220A, 220B may both be controlled by the output of the NOR gate 224.

Figure 4:
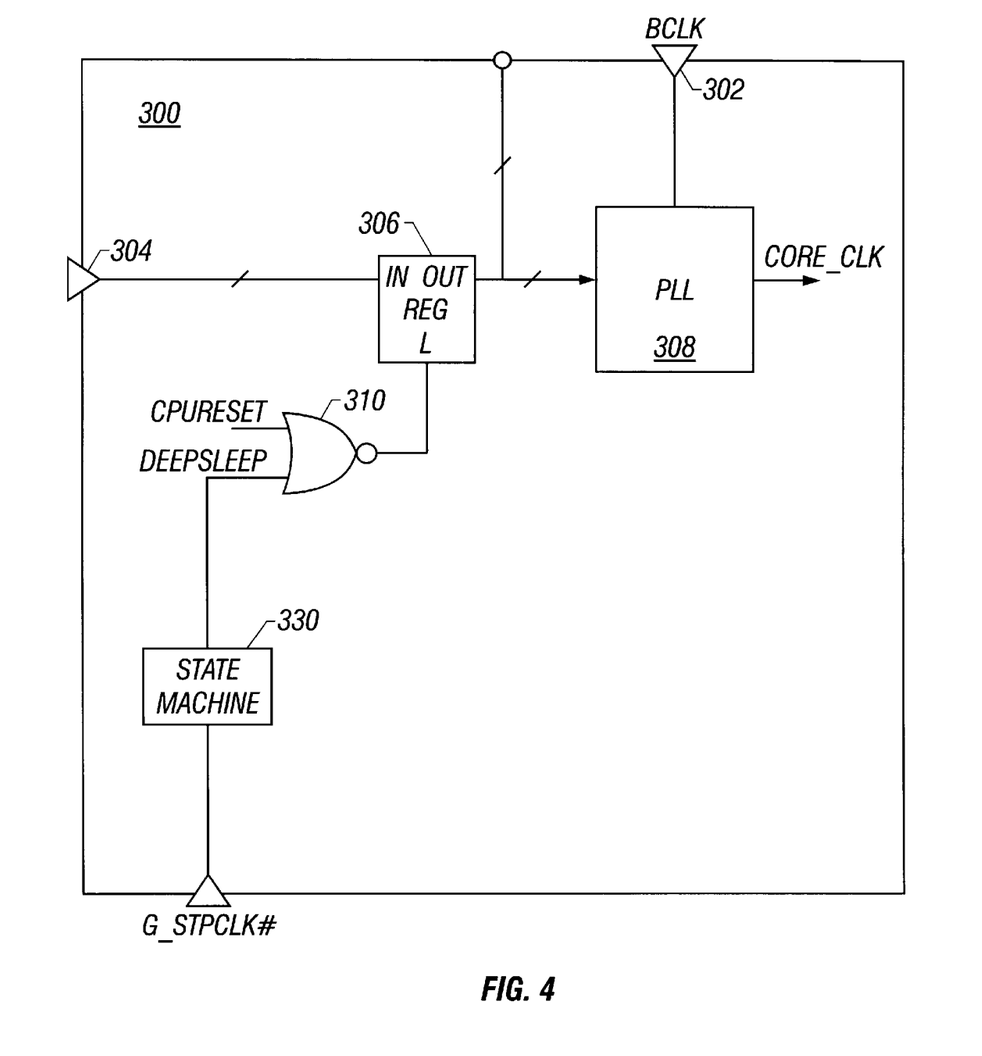

Referring to FIG. 4, according to yet another embodiment of the invention, the core clock frequency of a processor 300 may be changed without the use of fuse banks or additional I/O pins (such as the LO/HI# pin) on the processor. This embodiment saves die space for the processor as well as reduces the number of I/O pins that may be needed to implement the core clock frequency adjustment capability. In this embodiment, I/O pins 304 that are not used for other purposes during CPU reset or in the low activity state are routed to a register 306 having a latch input controlled by a NOR gate 310. The register 306 is accessible by software by an I/O or memory read. The NOR gate 310 receives the signal DEEPSLEEP, which is provided by a state machine 330 or alternatively, by an input pin of the processor 300, and the signal CPURESET. When the output terminal of the NOR gate 310 is low, indicating that the processor 300 is either in reset state or in a low activity state, the register 306 allows the states on I/O pins 304 to flow through the register to a PLL circuit 308 that receives the external clock BCLK on pin 302 for generating the core clock CORE_CLK. When the processor 300 is out of reset or the low activity state, the NOR gate 310 asserts its output terminal high to latch the value present on the I/O pins 304. This maintains the core clock frequency until the next change condition is detected.

Again, if a Pentium® family processor is used, the I/O pins 304 may be one or more of the following signals: LINT[1], LINT[0], A20M#, and IGNNE#. Alternatively, other suitable I/O pins of the processor may also be used.

Thus, according to some embodiments, bus fraction data or some other predefined data or indication is provided by various storage elements, including I/O pins and fuse banks. In further embodiments, other types of storage elements may be used, including non-volatile memory and so forth.

Figure 5:
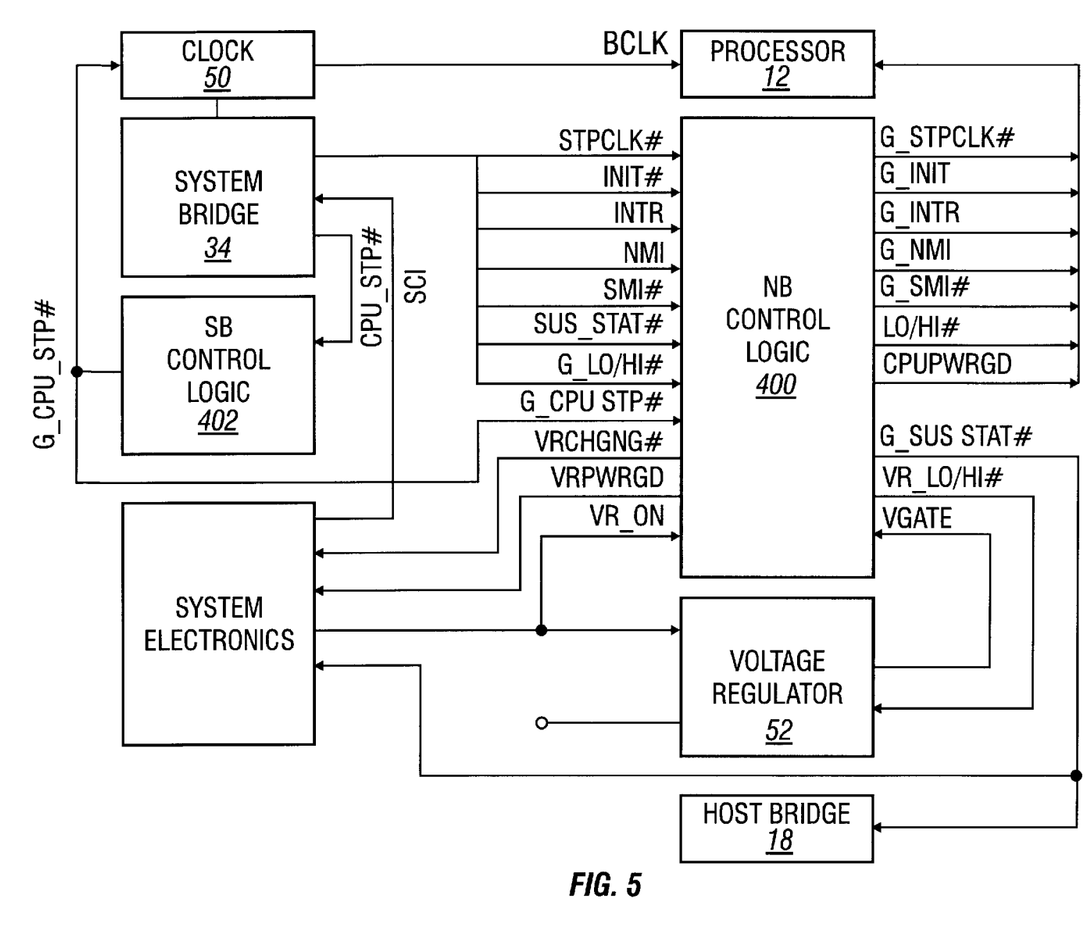
FIG. 5 is a block diagram of power management control logic in the system of FIG. 1.

Referring to FIG. 5, power management control logic according to an embodiment for controlling the core clock frequency and the supply voltage level to the processor 12 is shown. In the illustrated embodiment, the control logic may be separated into a first portion 400 and a second portion 402. However, it is contemplated that the control logic may also be integrated in one component. The first control logic portion 400 may be included in the host bridge 18, and the second control logic portion 402 may be included in the system bridge 34. Alternatively, the first and second control logic portions may be implemented as separate chips.

In addition, instead of being configured with host and system bridges 18 and 34 as illustrated in FIG. 1, the circuitry may be implemented as a memory hub (including interfaces to the processor and system memory) and an I/O hub (including interfaces to the system bus and secondary bus). In this other configuration, the control logic 400, 402 may be implemented in the memory hub. With the memory and I/O hubs, messages rather than signals may be used to provide the same functionality as the control logic 400, 402. For example, the I/O hub may send a "Prepare for Deep Sleep" message to the memory hub. Alternatively, a serial link may be used for communication with the voltage regulator 52 and clock generator 50.

The control logic 400, 402 provides control signals to the voltage regulator 52 to adjust its voltage levels and to the processor 12 to adjust the processor's frequency. In addition, the power management control logic 400, 402 is responsible for placing the processor 12 into a low activity state to transition the system to a different performance state.

A brief description of the interface signals between the power management control logic 400, 402 and the other components of the system follows. The signal LO/HI# provided by the control logic portion 400 to the processor 12 determines if the core clock frequency of the processor 12 is at a high or low level. As an example, the core clock frequency may vary between 350 MHz and 450 MHz depending on whether LO/HI# is active or not. It is noted that additional signals may be used to adjust the core clock frequency to more than two levels. A signal VR_LO/HI# is provided by the control logic portion 400 to the voltage regulator 52 to adjust the voltage level supplied by the voltage regulator 52 up or down. Additional signals other than VR_LO/HI# may also be used to control the voltage levels provided by the voltage regulator 52. In the illustrated embodiments, a signal G_LO/HI# from the system bridge 34 indicates the desired system state and controls the states of LO/HI# and VR_LO/HI#. Additional signals may be used to define more than two system states. A signal G_STPCLK# is provided to the processor 12 and a signal G_CPU_STP# is provided to the clock generator 50 to place the processor 12 into a low activity state (e.g., deep sleep, stop grant, C2, or C3 state) so that the clock frequency and supply voltage level of the processor 12 may be varied.

A signal VRCHGNG# is provided by the control logic 100 to system electronics circuitry (e.g., the host bridge 18 and system bridge 34) to indicate that the voltage level from the voltage regulator 52 is changing. A signal VRPWRGD from the control logic portion 400 to system electronic circuitry (e.g., the host bridge 18 and system bridge 34) indicates when the output from the voltage regulator 52 is within specification. According to embodiments of the invention, the voltage regulator interface provided by the control logic portion 400 allows the voltage regulator 52 to change settings without causing a power-on reset of the system. As a result, the performance state transition (including adjusting the processor's core clock frequency and voltage level) may be accomplished without resetting the system, which invalidates the system context.

According to one embodiment of the invention, when the voltage regulator on signal (VR_ON) is active (which is true whenever the system is on), the voltage regulator 52 settles to the output selected by VR_LO/HI# (a low level or a high level). By way of example, a low supply voltage level may be about 1.3 V while a high supply voltage level may be about 1.8 V. When the outputs of the regulator 52 are on and within specification, the voltage regulator 52 asserts a signal VGATE, which in turn controls the state of the signal VRPWRGD provided by the control logic portion 400 to system electronics circuitry. To prevent a system reset, the signal VRPWRGD is maintained active during the performance state transition by the control logic irrespective of the condition of VGATE.

It is contemplated that when the processor 12 is transitioning from one performance state to another, the voltage regulator output may or may not change, depending on its original level. It is possible that the voltage regulator output level may be valid at both performance states, in which case a voltage level adjustment is not necessary.

Different events may be used to trigger performance state transitions. For example, a user (through a graphical user interface) may specify the performance state of the system. Other events may include docking or undocking of the system 10 and the coupling or discoupling of the external source port 58 to an external power source (such as an AC power source). Environmental changes in the system may also trigger a performance state change, including an over-temperature condition where a predefined temperature threshold in a thermal zone of the computer system has been violated. In addition, system usage may be monitored, with events generated to trigger switching to a lower performance state if usage is low, for example.

Performance state change events may be handled a number of different ways. A device driver may be registered to receive such events, for example. Alternatively, such events may generate a system management interrupt (SMI) such that an SMI handler is invoked. In addition, A BIOS routine may be used to respond to a generated power event. Other mechanisms are also possible.

Figure 6:
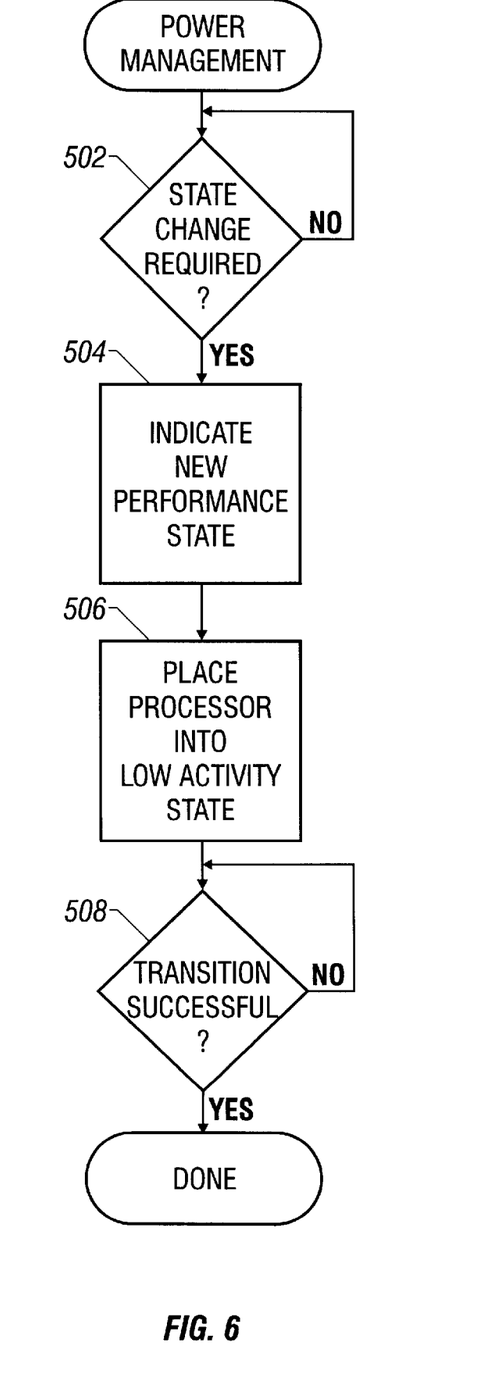
FIG. 6 is a flow diagram of a power management module in the system of FIG. 1.

Referring to FIG. 6, the process executed by a power management module according to one embodiment in the system to control performance state transitions is illustrated. The power management module may be implemented as a software module, in system firmware (e.g., system BIOS or SMI handler), as part of the operating system, as a device driver, or as a combination of the above. The power management module determines (at 502) if a performance state change is to be employed in response to a received event, indicating a power supply transition, docking/undocking, a user command or other events. Thus, for example, if the system was originally battery operated, and has been plugged into the AC outlet, then the system may transition to a high performance state. If removed from the AC outlet, then the system may transition to a lower performance state. Next, the power management module indicates (at 504) the new performance state that the system is to transition to. This may be performed, for example, by writing a pre-defined value to a control register to indicate the new performance state of the processor 12. The control register may be defined in memory or I/O address space. In addition, programming of the control register may be defined under the ACPI specification. Thus, in one embodiment, one or more ACPI objects may be created to indicate to the operating system that the computer is capable of transitioning between or among different performance states and to denote the resources that may be used by the operating system to perform the transitions. The location and structure of the control register may be defined under an ACPI object. Further, one or more ACPI objects may define the number of performance states available, the core clock frequencies and supply voltage levels to be used in the performance states, the expected power consumption in each performance state, and other information.

Next, the power management module places (at 506) the processor 12 into a low activity state (e.g., deep sleep, stop grant, C2, C3, or other state). While the processor 12 is in the low activity state, the performance mode of the processor 12 may be changed by, for example, by changing the core processor clock frequency and adjusting the core voltage level. Once the processor 12 has transitioned to the low activity state, the control logic 400, 402 takes over the performance state transition, as further described below in connection with FIG. 7.

The power management module next determines if the performance state transition was successful (at 508 in FIG. 6). This may be determined by reading a predefined register in the processor 12, which may be the register 108 of the processor 12. With processors 200 and 300, registers 208 and 306, respectively, may be used instead. The predetermined register may be updated by the processor 12 to indicate the new core clock frequency. The power management module compares this register value to an expected value to determine whether the transition was successful. If the transition was successful, then the power management module exits. If unsuccessful, the power management module may time out after a predetermined time period, and a failed indication may be provided.

Figure 7:
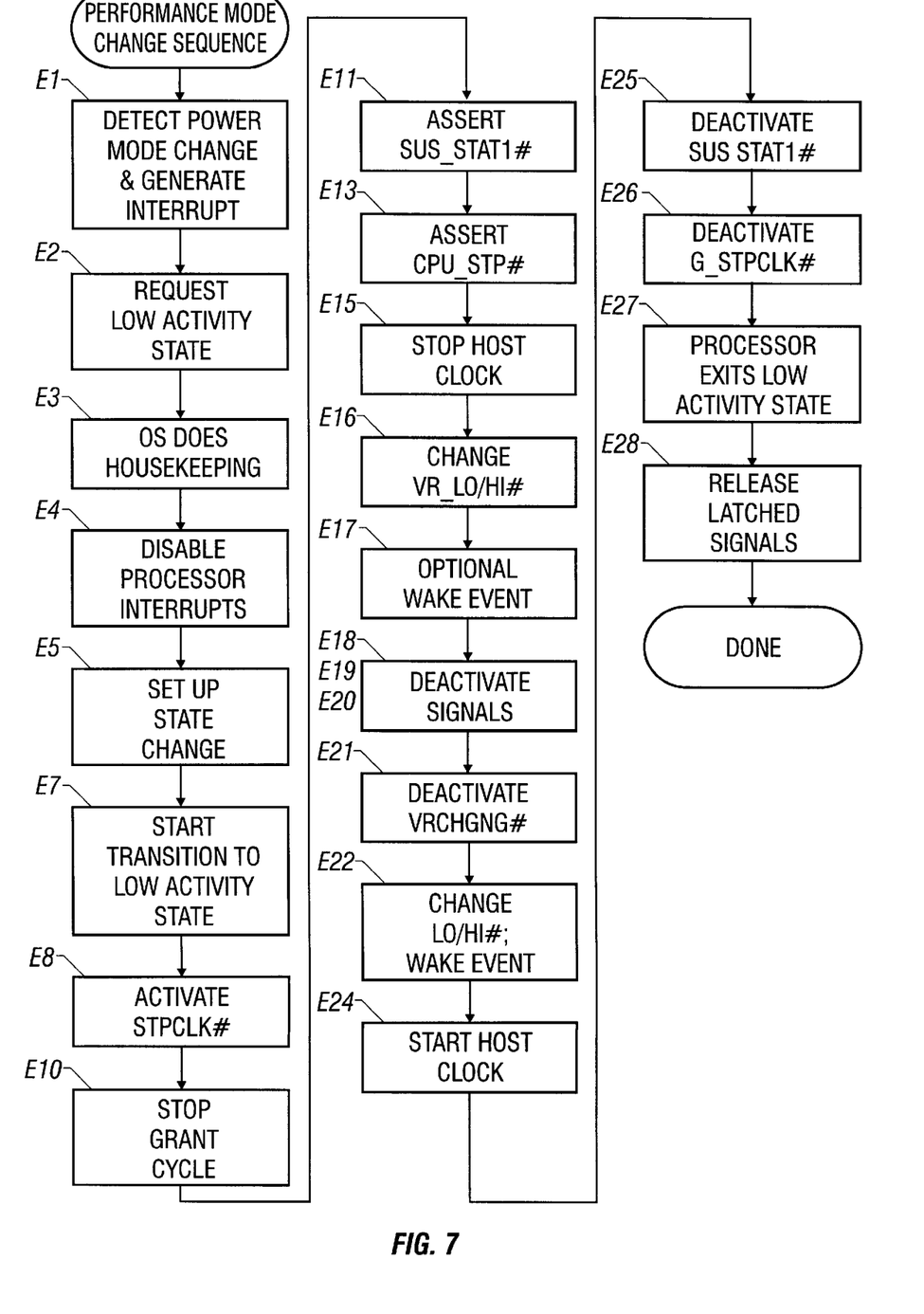
FIG. 7 is a flow diagram of a performance mode change sequence in the system of FIG. 1.

Referring to FIG. 7, the performance state change sequence is illustrated in greater detail. The sequence is performed by a combination of software, firmware, and hardware, including the power management module, the control logic 400, 402, and other modules. It is contemplated, however, that the sequence may be varied and performed by different system modules. Reference is also made to the timing diagram of FIG. 8, which illustrates relative timings of the signals and events involved in the performance state change sequence.

When the system detects a power mode change (such as in response to the power management module writing to the predetermined control register to indicate the new performance state), an interrupt may be generated (at E1), which may be an interrupt defined by the ACPI specification. When the interrupt handler (e.g., an ACPI driver) is loaded, it recognizes the power mode change and, in response, requests that the operating system failure place the processor into the low activity state (at E2), which in one example may be the ACPI C3 state. Next, the operating system performs system housekeeping (at E3) and gives control of the system to the interrupt handler.

Next the interrupt handler disables the interrupts to the processor 12 (at E4), although interrupts that may be handled by the system bridge 34 are not affected. It is noted that processor interrupts may not be disabled for more than a predetermined time period (e.g., about 200 microseconds) in order for the performance state transition to be seamless. For example, overrun errors on buffered networks or serial ports may occur if the latency caused by the performance state switching is greater than the predetermined time period.

Next, the interrupt handler sets up (at E5) the performance state change by performing an I/O write to a register in the system bridge 34 to control the transition of the signal G_LO/HI#. As illustrated at E6 in FIG. 8, this causes the signal G_LO/HI# from the system bridge 34 to change state.

Next, the interrupt handler initiates (at E7) the transition of the processor 12 to the low activity state, which may in one example be performed by the interrupt handler performing a memory or I/O access of a predefined register in the system bridge 34, such as an I/O read to the level 3 register in the 82371 series of system bridge chips (PIIX3 or PIIX4 chips) from Intel Corporation. In response to the level 3 read, the system bridge 34 activates (at E8) the signal STPCLK# to begin a processor stop clock sequence. This in turn activates (at E9) a signal G_STPCLK# from the control logic portion 400 to the processor 12.

Next, at E10, the processor 12 issues a stop grant cycle in response to detection of the activation of G_STPCLK#. When the system bridge 34 recognizes the stop grant cycle, it asserts a signal SUS$_{13}$ STAT1# (at E11) to the control logic portion 400, which in turn activates a signal G_SUS_STAT1# (at E12) provided to the host bridge 18 that may perform refresh control of system memory 16. In the embodiment in which the processor clock BCLK is disabled, another clock (e.g., a suspend clock) may be employed to perform system memory refresh. Next, the system bridge 34 asserts a signal CPU_STP# (at E13) to the control logic portion 402, which in turn activates a signal G_CPU_STP# (at E14) that is routed to the clock generator 50 and the control logic portion 400. In response to activation of G_CPU_STP#, the clock generator 50 deactivates the host clock (BCLK) at E15. At this point, the control logic portion 400 may latch certain signals which may not be changed during the deep sleep state of the processor 12, such as signals INIT#, INTR, NMI, and SMI# used by the Pentium® family of processors, which are latched as signals G_INIT, G_INTR, G_NMI, and G_SMI# provided to the processor 12. In addition, VRCHGNG# is also activated.

After a predetermined delay following activation of G_CPU_STP# (e.g., 10 microseconds), the control logic portion 400 changes the state of the signal VR_LO/HI# (if necessary) to begin changing the voltage level of the voltage regulator 52. The predetermined delay is to allow time for the PLL circuit in the processor 12 to deactivate. Depending on whether the voltage level of the voltage regulator 52 is within or out of specification, the signal VGATE driven by the voltage regulator 52 may or may not deassert. At this point, the voltage regulator setting is changing, but the processor core clock frequency transition does not begin until the voltage level settles. Further, as illustrated, in FIG. 8, the power good indications VRPWRGD and CPUPWRGD remain active to prevent system reset.

Next, the interrupt handler may issue an asynchronous wake event (at E18) to initiate system exit from the low activity state. According to an embodiment of the invention, this wake event is optional and may occur any time after activation of G_CPU_STP#. Alternatively, a system controller interrupt (SCI) may be issued to initiate exit from the low activity state. If this is caused by the assertion of VRCHGNG#, the overall latency is reduced. If the wake event occurs at E17, which is before the voltage regulator state change and the core processor clock frequency change have completed, the wake event is blocked by latching certain signals in the control logic 400 and 402.

In response to the wake event, the system bridge 34 deactivates the signal CPU_STP# (at E18). However, the signal G_CPU_STP# is maintained latched by the control logic portion 402 to continue in the low activity state. The signals SUS_STAT1# and STPCLK# are also deactivated (at E19 and E20) in response to deactivation of CPU_STP#, but the control logic portion 400 maintains the states of G_SUS_STAT1# and G_STPCLK# latched.

Figure 8:
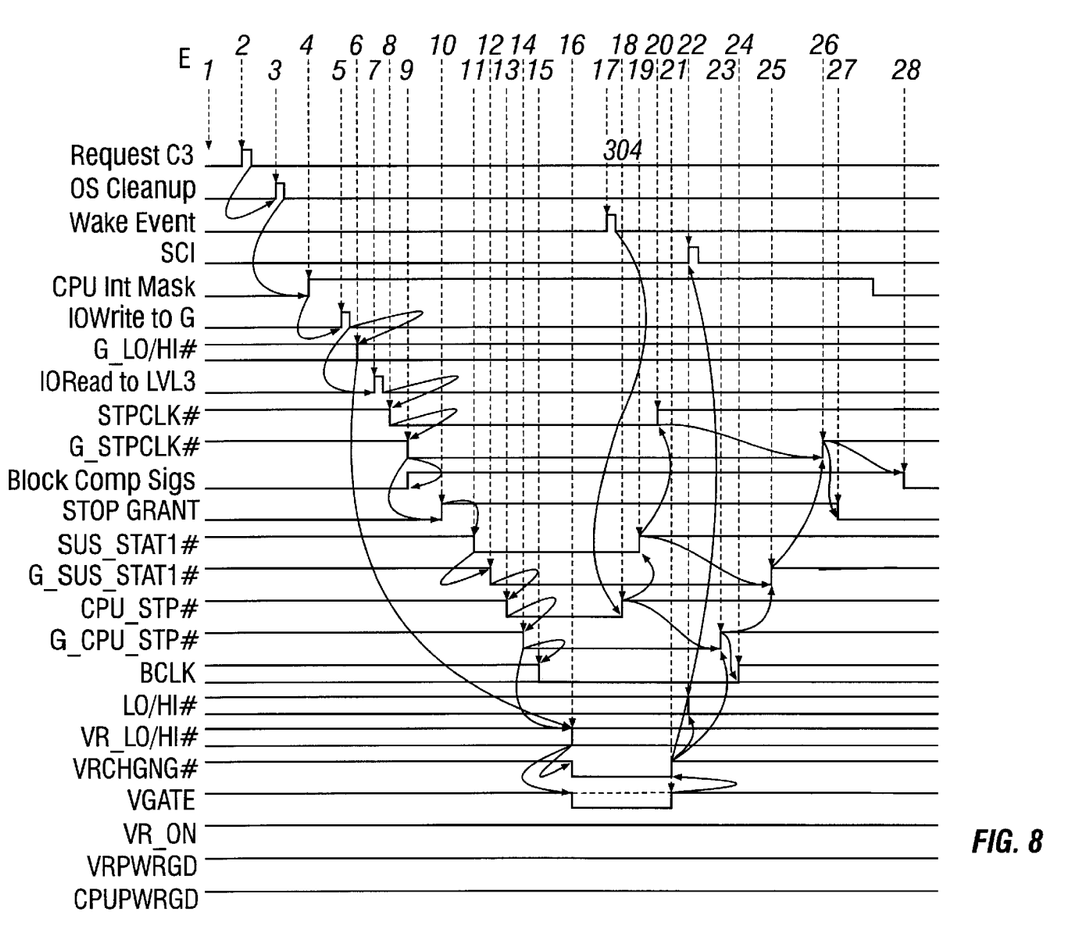
FIGS. 8 and 9 are timing diagrams of signals and events in the performance mode change sequence of FIG. 7.

The control logic portion 400 then waits for the signal VGATE to be activated by the voltage regulator 52 (at E21) to indicate that the voltage levels have settled or to wait until a predetermined time period has elapsed (e.g., 100 microseconds) and VGATE is asserted. When either occurs, the control logic portion 400 changes the state of LO/HI# to change the core clock frequency of the processor 12 (at E22) and deasserts VRCHGNG#. By this time, a synchronous wake event (which may be in the form of a system control interrupt or SCI) may be asserted by the system bridge 34 to force the system out of the low activity state. The SCI event is independent of the asynchronous wake event that may be generated at E17. Either one of the wake events may be used. In FIG. 8, generation of the asynchronous wake event (at E17) before SCI allows early deactivation of CPU_STP#, SUS_STAT1#, and STPCLK# so the control logic controls the timing of G_CPU_STP#, G_SUS_STAT1#, and G_STPCLK#.

Next, once VRCHGNG# deasserts to indicate the voltage regulator outputs have settled and if the signal CPU_STP# is inactive, the signal G_CPU_STP# is also deactivated (at E23). When this occurs, the host clock is started by the clock generator 50 (at E24). After the host clock starts, the control logic portion 400 waits a predetermined time period (e.g., greater than 64 microseconds) before deactivating G_SUS_STAT1# (at E25). A predetermined time period after that, the signal G_STPCLK# is deactivated (at E26).

Figure 9:
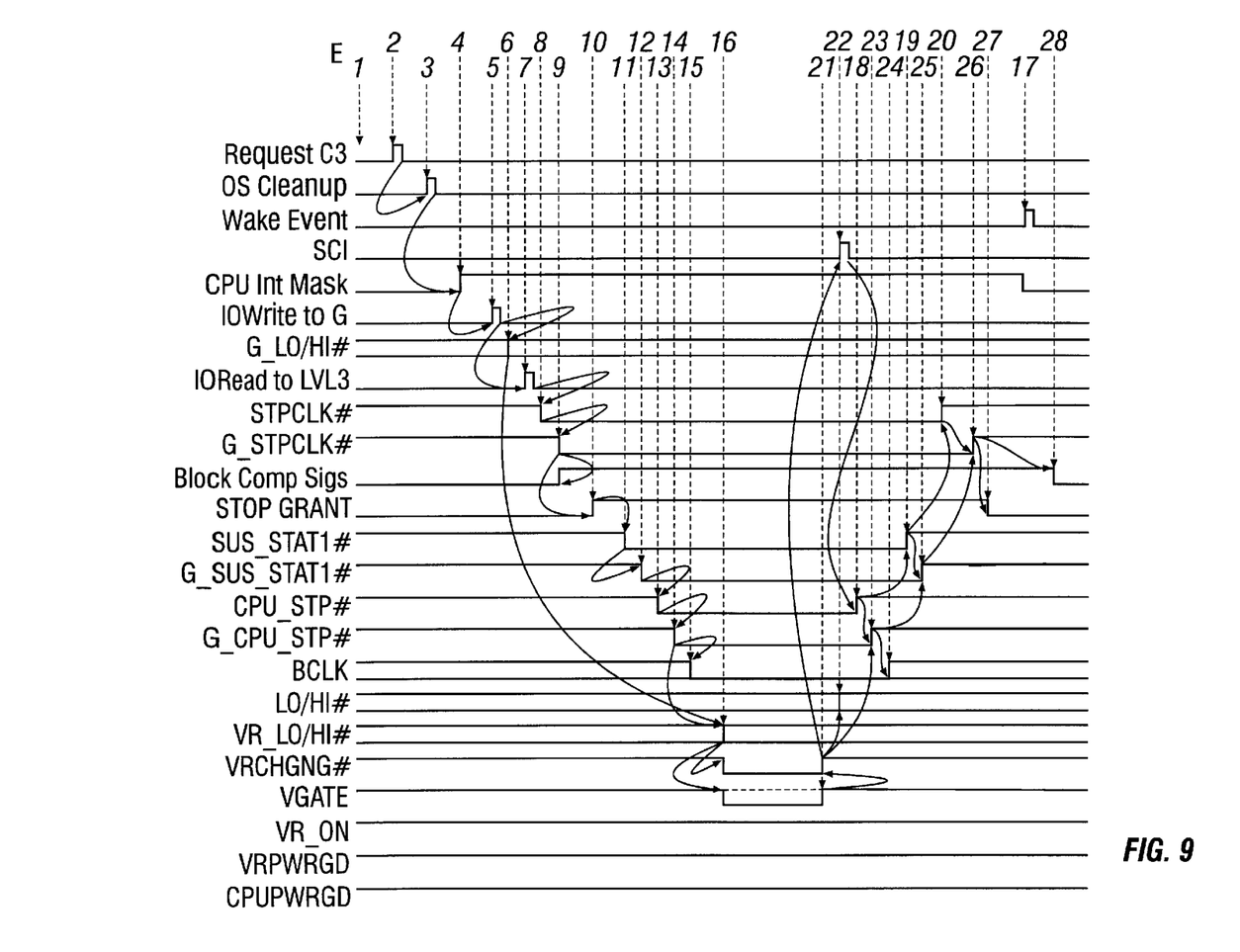

As noted above in FIG. 8, the control logic portion 400 controls the deassertion of the signals G_CPU_STP#, G_SUS_STAT1# and G_STPCLK# since the wake event issued at E17 has already triggered deassertion of the CPU_STP#, SUS_STAT#, and STPCLK# signals. In contrast, in FIG. 9, if the wake event E17 is not issued until much later after the SCI, the interrupt SCI generated at E22 triggers deassertion of STPCLK#, SUS_STAT1#, and CPU_STP#. As illustrated, once VRCHGNG# is deactivated, G_CPU_STP# is not deactivated until after CPU_STP# is deasserted by the system bridge 34 in response to the SCI. Consequently, the sequence of events and signals to wake the processor 12 is changed as shown in FIG. 9.

After the signals G_STPCLK#, G_CPU_STP#, and G_SUS_STAT1# are all deasserted, the processor 12 exits the low activity state (at E27) in the new performance state. Finally the latched signals INIT#, INTR, NMI, and SMI# are released (at E28) and the system is allowed to proceed with normal operations.

After the internal clock frequency and voltage settings have changed, predefined register bits (including bits in register 108 in the processor 12, or in alternative embodiments, register 208 or 306 in processor 200 or 300, respectively) may be updated. These registers are accessible by software to determine if the performance state change has been successfully made. The predefined register bits may be mapped to a memory or I/O address of the processor 12, the voltage regulator 52, or a combination of both. Alternatively, the predefined register bits may be found in system memory 16.

A power management control system has been described that controls the switching of a computer system between or among different performance states (in which core clock frequencies of one or more components are varied) in response to predetermined events. The performance state switching is performed after the processor is placed into a low activity state. An advantage of such a system is that a system reset may be avoided to switch performance states. In addition, by switching states depending on how the computer system is being utilized (e.g., internal or external power source, high temperature conditions, etc.), system performance may be improved "on the fly" without user intervention.

Other embodiments are within the scope of the following claims. Although one example described involves portable computer systems, the power control system described can be applied to other types of systems, including desktop systems or hand-held units. In addition, the core clock frequencies of components other than a processor may be varied to implement other embodiments of the invention. Such other components may include peripheral devices, bridge circuits, and controllers, for example. Further, the components may be located in any type of system (not limited to a computer system) in which clock frequencies need to be adjusted. The steps described in the power management sequence may be varied and still achieve similar results.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed:

1. A system comprising:
   a component receiving a reference clock and including a clock generator to generate an internal clock running at a first frequency; and
   a controller to generate a clock frequency change indication and to place the component into a low activity state,
   the clock generator having a setting changed in response to the clock frequency change indication to change the frequency of the internal clock to a second frequency while the component is in the low activity state,
   the clock generator at a first setting providing the internal clock at the first frequency based on the reference clock, and the clock generator at a second setting providing the internal clock at the second frequency based on the same reference clock.

2. The system of claim 1, wherein the component further includes a circuit to receive the clock frequency change indication and to change the clock generator setting in response.

3. The system of claim 2, wherein the circuit changes the clock generator setting also in response to the clock frequency change indication while the component is in reset.

4. The system of claim 1, wherein the low activity state includes a stop grant state.

5. The system of claim 1, wherein the low activity state includes a state in which the internal clock is disabled.

6. The system of claim 1, wherein the low activity state includes the C3 state of an Advanced Configuration and Power Interface Specification.

7. The system of claim 1, wherein the low activity state includes a deep sleep state.

8. The system of claim 1, wherein the component includes internal storage elements that maintain their settings while in the low activity state.

9. The system of claim 1, wherein the component further includes multiple fuse banks to provide different values representing corresponding clock frequencies.

10. The system of claim 9, wherein the component further includes a selection circuit controllable by a signal from the controller to select one of the fuse bank values.

11. The system of claim 10, wherein the component includes circuitry to sample the signal while the component is in the low activity state.

12. The system of claim 11, wherein the clock frequency change indication includes the controller signal.

13. The system of claim 1, wherein the component further includes at least two sets of input pins to provide different values representing corresponding clock frequencies.

14. The system of claim 1, wherein the component further includes at least one fuse bank and a set of input pins to provide different values representing corresponding clock frequencies.

15. The system of claim 14, wherein the component further includes a selection circuit controllable by the controller to select the fuse bank or the set of input pins.

16. The system of claim 15, the controller being able to write a value to the set of input pins.

17. The system of claim 1, wherein the component further includes a set of input pins driven to a specific value to represent a target clock frequency.

18. The system of claim 17, wherein the component further includes a register controllable to receive the specific value during the low activity state.

19. The system of claim 18, wherein the register is adapted to latch the specific value during normal operation.

20. The system of claim 18, wherein the register is further controllable to receive the specific value during component reset.

21. A device comprising:

an input pin;

a clock generator receiving a first clock to generate an internal clock having a first frequency;

a receiving circuit to sample a state of the input pin in response to a low activity state of the device, the clock generator to adjust the clock frequency to a second frequency based on the sampled state of the input pin, the internal clock at either the first or second frequency being based on the first clock.

22. The device of claim 21, further comprising at least an additional input pin sampled by the receiving circuit.

23. The device of claim 21, further comprising storage elements containing different values selectable by the receiving circuit to control the internal clock frequency.

24. The device of claim 23, further comprising a selection circuit controllable to select one of the values from the storage elements.

25. The device of claim 24, wherein the storage elements include a set of input pins that are adapted to receive input signals.

26. The device of claim 24, wherein the storage elements include a set of one or more fuses programmable to provide a value.

27. A method of changing a frequency of a clock in a component, the clock being based on a reference clock received by the component, comprising:

generating a clock frequency change indication;

placing the component into a low activity state;

resetting an internal clock generator to adjust an internal clock frequency while the component is in the low activity state in response to the clock frequency change indication; and providing the internal clock based on the reference clock at a new frequency.

28. The method of claim 27, further comprising selecting one of multiple values to reset the clock frequency.

29. The method of claim 28, wherein the selecting includes routing a value from one of multiple storage elements.

30. The method of claim 28, wherein the selecting includes loading a value from one or more input pins of the component.

31. A component comprising:

an input for a reference clock;

a clock generator responsive to the reference clock to produce an internal clock, the clock generator capable of changing a frequency of the internal clock while in a low activity state;

a first element having a first value;

a second element having a second value; and the internal clock frequency that is based on the reference clock being dependent on which of the first and second values is received by the clock generator.

32. The component of claim 31, further comprising at least one other element having another value.

33. The component of claim 31, wherein at least one of the first and second elements includes a fuse bank.

34. The component of claim 31, wherein at least one of the first and second elements includes a set of one or more input pins.

35. The component comprising:

an input for a reference clock;

a clock generator responsive to the reference clock to produce an internal clock, the clock generator capable of changing a frequency of the internal clock while in a low activity state; and an element programmable to one of plural values, the internal clock having plural frequencies based on the reference clock corresponding to the plural programmable values of the element.

* * * * *